United States Patent
Campbell et al.

(10) Patent No.: US 10,667,433 B2
(45) Date of Patent: May 26, 2020

(54) IMPLEMENTING CONTAINED THERMAL INTERFACE MATERIAL FOR PLUGGABLE APPLICATIONS

(71) Applicant: International Business Machines Corporation, Armonk, NY (US)

(72) Inventors: Eric J. Campbell, Rochester, MN (US); Jennifer Bennett, Rochester, MN (US); Sarah K. Czaplewski-Campbell, Rochester, MN (US); Elin F. LaBreck, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/996,834

(22) Filed: Jun. 4, 2018

(65) Prior Publication Data

US 2019/0373774 A1  Dec. 5, 2019

(51) Int. Cl.
*H05K 7/20* (2006.01)
*H05K 5/02* (2006.01)
*G02B 6/42* (2006.01)
*F28F 21/08* (2006.01)

(52) U.S. Cl.
CPC ....... *H05K 7/20481* (2013.01); *F28F 21/082* (2013.01); *F28F 21/084* (2013.01); *F28F 21/085* (2013.01); *G02B 6/4284* (2013.01); *H05K 5/0247* (2013.01)

(58) Field of Classification Search
CPC . H05K 7/20481; H05K 5/0247; F28F 21/082; F28F 21/084; F28F 21/085; G02B 6/4284

USPC .......................................................... 361/708
See application file for complete search history.

(56) References Cited

U.S. PATENT DOCUMENTS

| | | | | |
|---|---|---|---|---|
| 3,971,186 A | * | 7/1976 | Havelka | F16B 2/14 403/374.4 |
| 3,975,805 A | * | 8/1976 | Spurling | F16B 2/18 403/374.3 |
| 4,751,963 A | * | 6/1988 | Bui | H05K 7/1404 165/80.2 |
| 4,819,713 A | * | 4/1989 | Weisman | H05K 7/1404 165/80.2 |
| 4,994,937 A | * | 2/1991 | Morrison | H05K 7/1404 174/16.3 |
| 5,036,428 A | * | 7/1991 | Brownhill | H05K 7/1404 165/80.1 |
| 5,090,840 A | * | 2/1992 | Cosenza | H05K 7/1404 361/759 |
| 5,290,122 A | * | 3/1994 | Hulme | H05K 7/1404 165/80.2 |
| 5,827,585 A | * | 10/1998 | Giannetti | H05K 7/1418 428/362 |

(Continued)

FOREIGN PATENT DOCUMENTS

JP   2015203830 A   11/2015

*Primary Examiner* — Anatoly Vortman
(74) *Attorney, Agent, or Firm* — Kelsey M. Skodje

(57) ABSTRACT

A contained thermal interface material for pluggable applications, structures, and a method for implementing thermal coupling between components with a contained thermal interface material for pluggable applications are provided. A thermal interface material is combined with a metal member providing effective thermal coupling between components for plugging and unplugging thermal management applications.

15 Claims, 7 Drawing Sheets

(56) References Cited

U.S. PATENT DOCUMENTS

| | | | |
|---|---|---|---|
| 5,954,122 A * | 9/1999 | Sittig | H05K 7/1404 |
| | | | 165/80.2 |
| 6,523,608 B1 | 2/2003 | Solbrekken et al. | |
| 6,851,869 B2 | 2/2005 | Miller et al. | |
| 6,926,955 B2 | 8/2005 | Jayaraman et al. | |
| 7,219,713 B2 | 5/2007 | Gelorme et al. | |
| 7,483,271 B2 * | 1/2009 | Miller | H05K 7/1404 |
| | | | 165/80.2 |
| 7,663,883 B2 * | 2/2010 | Shirakami | H01L 23/373 |
| | | | 165/46 |
| 7,885,076 B2 * | 2/2011 | Sharifipour | H05K 7/20463 |
| | | | 174/541 |
| 8,505,891 B2 * | 8/2013 | Guyenot | H05K 7/1417 |
| | | | 206/219 |
| 8,518,304 B1 | 8/2013 | Sammakia et al. | |
| 8,526,184 B2 * | 9/2013 | Sullivan | H05K 7/1404 |
| | | | 165/80.2 |
| 8,708,741 B2 | 4/2014 | Tanaka et al. | |
| 8,929,076 B2 | 1/2015 | Zhang et al. | |
| 9,222,735 B2 | 1/2015 | Hill et al. | |
| 2003/0223197 A1 * | 12/2003 | Hulan | H05K 7/1404 |
| | | | 361/719 |
| 2005/0155752 A1 | 7/2005 | Larson et al. | |
| 2007/0177367 A1 * | 8/2007 | Bailey | H01L 23/26 |
| | | | 361/808 |
| 2010/0226106 A1 * | 9/2010 | Suarez | H05K 7/1404 |
| | | | 361/759 |
| 2014/0170898 A1 * | 6/2014 | Elison | H05K 7/20454 |
| | | | 439/487 |
| 2017/0133777 A1 * | 5/2017 | Little | H01R 24/60 |

\* cited by examiner

IMPLEMENTING CONTAINED THERMAL INTERFACE MATERIAL FOR PLUGGABLE APPLICATIONS

FIELD OF THE INVENTION

The present invention relates generally to the data processing field, and more particularly, relates to a contained thermal interface material for pluggable applications, structures, and a method for implementing thermal coupling between components with a contained thermal interface material for pluggable applications.

DESCRIPTION OF THE RELATED ART

Efficient cooling of components for pluggable applications is needed. For example, next generation fiber optic cables require advanced thermal solutions in order to cool components in the connector and receptacle. For applications involving insertion of a cable or other component, a traditional thermal interface material (TIM), such as grease, gel, pad, and the like, is not applicable because the TIM would smear or be removed during unplugging and replugging.

An ideal thermal interface solution is not available for such pluggable applications. Known thermal interface arrangements typically fail to be wear resistant and compliant enough to rebound when the cable is plugged.

A need exists for an efficient and effective contained thermal interface material for pluggable applications, structures, and a method for implementing thermal coupling between components with a contained thermal interface material for pluggable applications.

SUMMARY OF THE INVENTION

Principal aspects of the present invention are to provide a contained thermal interface material for pluggable applications, structures, and a method for implementing thermal coupling between components with a contained thermal interface material for pluggable applications. Other important aspects of the present invention are to provide such contained thermal interface material, structures, and method substantially without negative effects and that overcome many of the disadvantages of prior art arrangements.

In brief, a contained thermal interface material for pluggable applications, structures, and a method for implementing thermal coupling between components with a contained thermal interface material for pluggable applications are provided. A thermal interface material is combined with a metal member providing effective thermal coupling between components for plugging and unplugging thermal management applications.

In accordance with features of the invention, the combined thermal interface material and metal member includes one of a compressible metal mesh and a spring-actuated shield.

In accordance with features of the invention, the combined thermal interface material and metal member prevents the thermal interface material from dislodging during plugging and unplugging operation In accordance with features of the invention, the combined thermal interface material and metal member is resilient to plugging forces while providing effective thermal conductivity.

In accordance with features of the invention, the combined thermal interface material and metal member is wear resistant and rebounds when a cable is plugged into a connector housing containing said combined thermal interface material and metal member.

In accordance with features of the invention, the combined thermal interface material and metal member prevents smearing, dislodging, and removal of the thermal interface material during plugging operations.

In accordance with features of the invention, the metal member is formed of a selected thermally conductive metal such as copper, copper alloys, aluminum, aluminum alloys, steel, and includes other conductive ceramic and conductive polymeric materials.

In accordance with features of the invention, the thermally conductive material is formed of a selected thermally conductive material including one of a putty, grease or pad thermally conductive material to provide the necessary thermal coupling between components.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a contained thermal interface material for pluggable applications, structures, and a method for implementing thermal coupling between components with a contained thermal interface material for pluggable applications are provided.

Figure 1A:
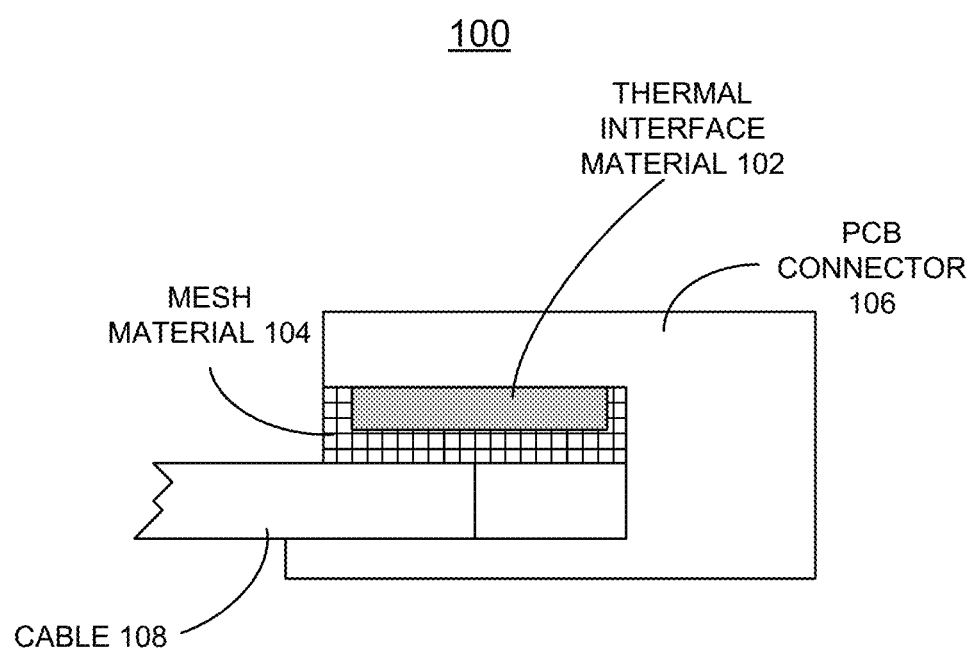
FIGS. 1A and 1B illustrates sectional views not to scale of an example contained thermal interface material for pluggable applications in accordance with a preferred embodiment.
Figure 1B:
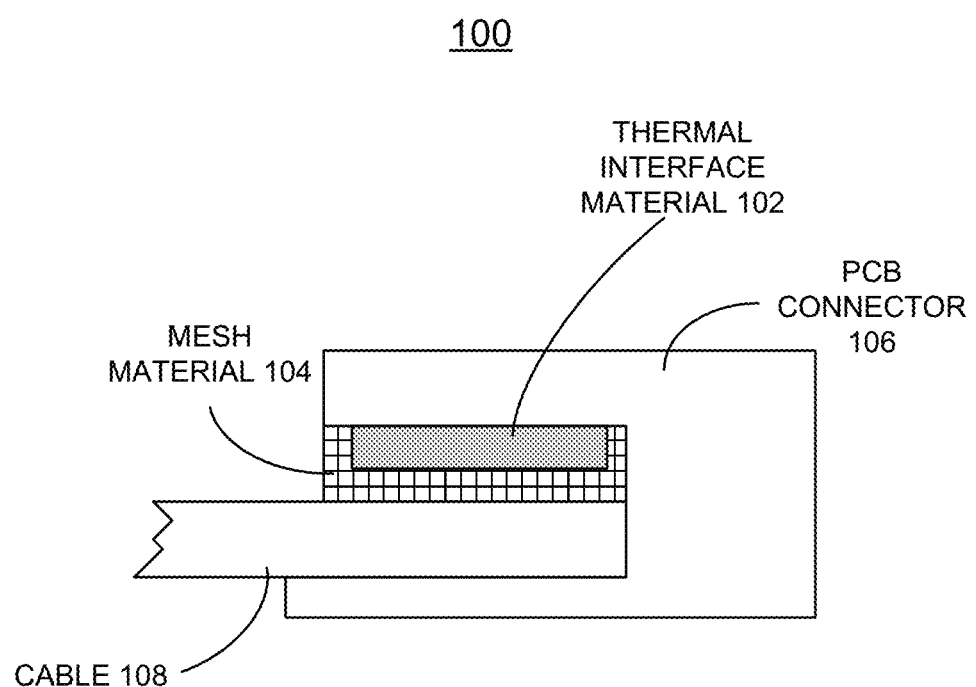

Having reference now to the drawings, in FIGS. 1A and 1B, there is shown a contained thermal interface material assembly for pluggable applications generally designated by the reference character 100 in accordance with a preferred embodiment. As shown in FIGS. 1A and 1B, the contained thermal interface material assembly 100 includes a thermal interface material 102 and a mesh material 104 in accordance with a preferred embodiment. The combined thermal interface material 102 and metal member 104 are disposed within a connector 106, such as a printed circuit board (PCB) connector housing 106 to provide the necessary thermal coupling between the PCB connector housing 106 and a cable 108, such as a fiber optic cable 108.

The thermal interface material (TIM) 102 is a grease or putty TIM that is encased by a layer of metal mesh 104. The combined TIM 102 and metal mesh 104 is incorporated in the PCB connector housing 106 as shown. The cable 108 or other component 108 is then plugged, making contact with the mesh 104, slightly compressing it as shown fully inserted in FIG. 1B. The purpose of the metal mesh barrier 104 on the outside of TIM 102 is to ensure the TIM retains its position and shape on the connector housing 106, while providing sufficient heat transfer.

Figure 2A:
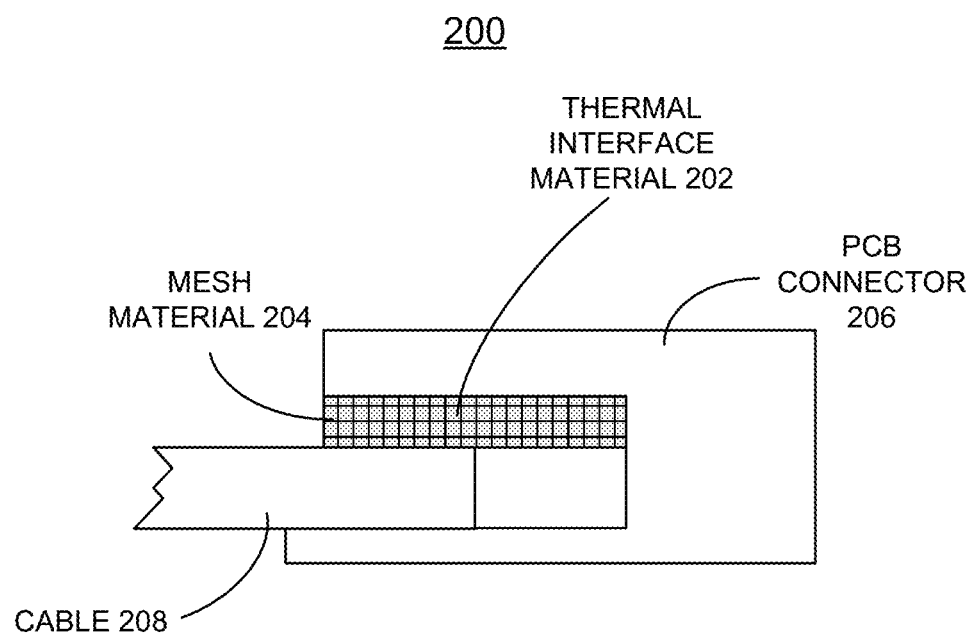
FIGS. 2A and 2B illustrates sectional views not to scale of another example contained thermal interface material for pluggable applications in accordance with a preferred embodiment.
Figure 2B:
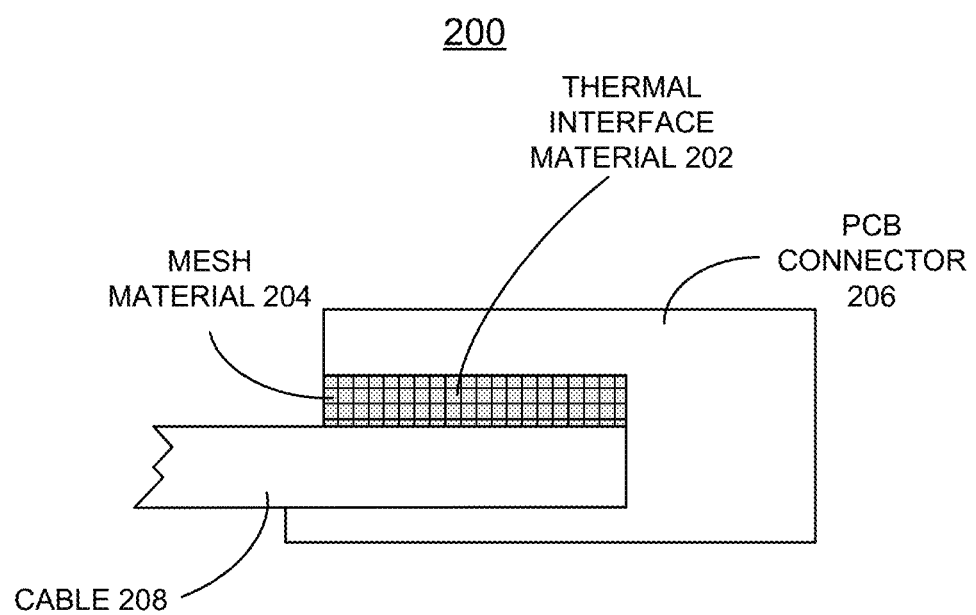

Referring to FIGS. 2A and 2B, there is shown another contained thermal interface material assembly for pluggable applications generally designated by the reference character 200 in accordance with a preferred embodiment. As shown in FIGS. 2A and 2B, the contained thermal interface material assembly 200 includes a thermal interface material 202 and a mesh material 204 in accordance with a preferred embodiment. The thermal interface material assembly 200 is similar to the contained thermal interface material assembly 100. In the thermal interface material assembly 200 the mesh material 204 is impregnated with the thermal interface material 202. The impregnated metal member 204 with thermal interface material 202 are disposed within a connector 206, such as a printed circuit board (PCB) connector housing 206 to provide the necessary thermal coupling between the PCB connector housing 206 and a cable 208, such as a fiber optic cable 208.

The impregnated metal member 204 with the thermal interface material 202 is a layer of metal mesh 204 with thermal interface material (TIM) 202 that is a grease or putty TIM. The impregnated metal member 204 with thermal interface material 202 is incorporated in the PCB connector housing 206 as shown. The cable 208 or other component 208 is then plugged, making contact with the impregnated metal member 204 with thermal interface material 202, slightly compressing it as shown fully inserted in FIG. 2B. The purpose of the impregnated metal member 204 with thermal interface material 202 is to ensure the thermal interface material 202 retains its position and shape on the connector housing 206, while providing sufficient heat transfer.

In both the contained thermal interface material assembly 100, 200 for pluggable applications, the metal member 104, 204 is a compressible metal mesh formed of a selected thermally conductive metal such as copper, copper alloys, aluminum, aluminum alloys, steel, and includes other conductive ceramic and conductive polymeric materials, and the thermal interface material 102, 202 is formed of a selected thermally conductive material such as a putty, grease or pad thermally conductive material to provide the necessary thermal coupling between components 106, 108 and 206, 208. In both the contained thermal interface material assembly 100, 200 the thermal interface material 102, 202 is prevented from dislodging during plugging and unplugging operation, the combined thermal interface material 102, 202 and metal member 104, 204 are resilient to plugging forces while providing effective thermal conductivity, that prevent smearing, dislodging, and removal of the thermal interface material during plugging operations, and are wear resistant and rebound when a cable 108, 208 is plugged.

It should be understood that in both the contained thermal interface material assembly 100, 200 for pluggable applications the thermal interface material 102, 202 and metal member 104, 204 could be incorporated within the connector 106, 206 or cable 108, 208 in accordance with features of the invention.

Figure 3A:
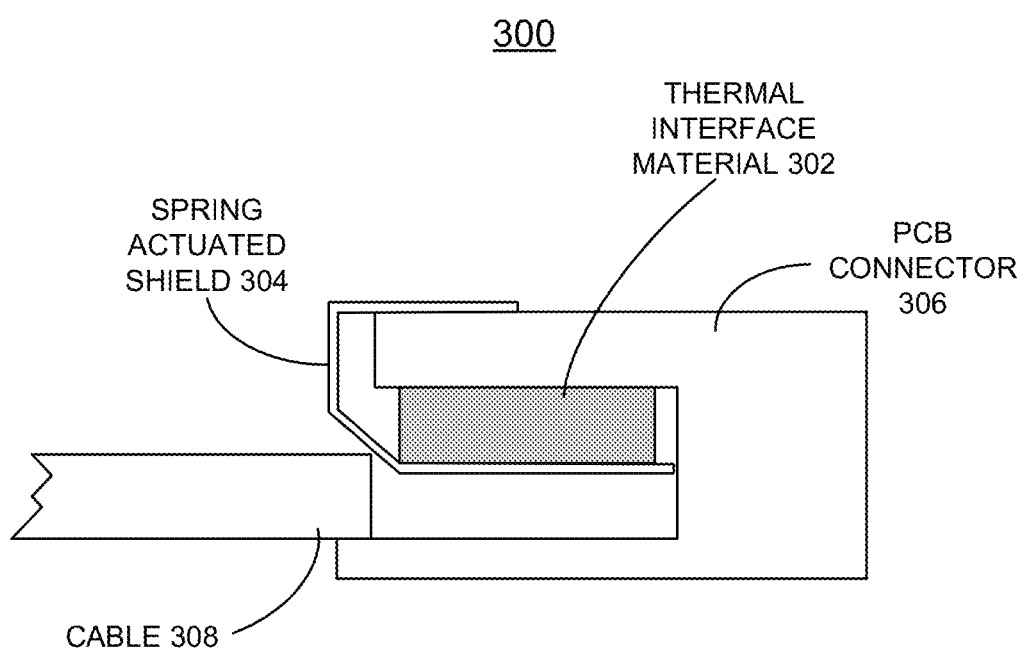
FIGS. 3A and 3B illustrates a sectional view not to scale of an example spring-actuated thermal interface material (TIM) shield for pluggable applications in accordance with a preferred embodiment.
Figure 3B:
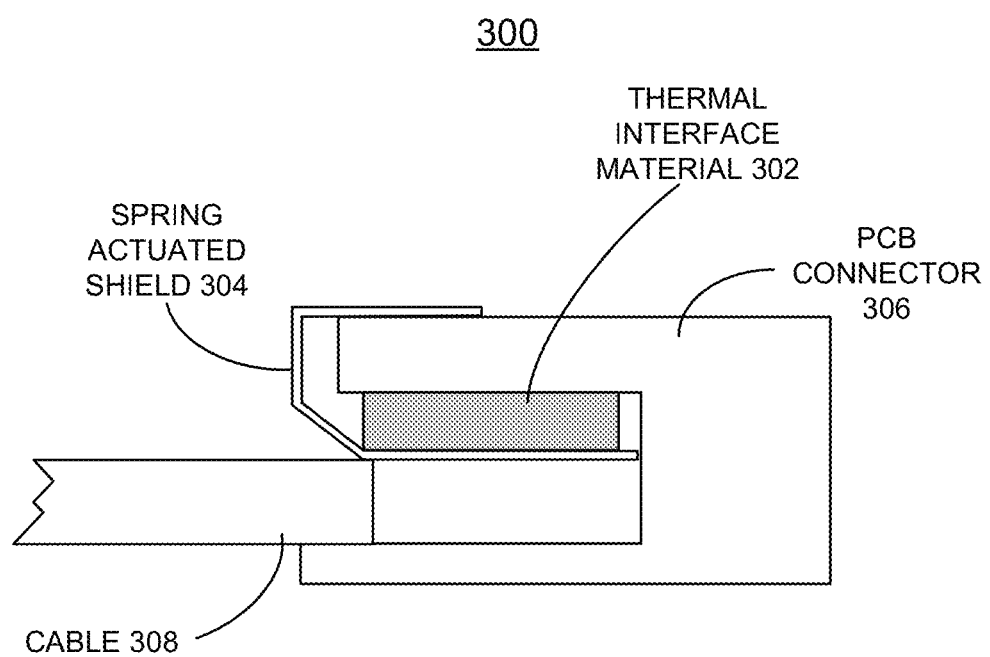

Referring to FIGS. 3A and 3B, there is shown another contained thermal interface material assembly generally designated by the reference character 300 including an example spring-actuated thermal interface material (TIM) shield for pluggable applications in accordance with a preferred embodiment. The contained thermal interface material assembly 300 includes a thermal interface material (TIM) 302 and a spring-actuated TIM shield 304 to prevent the cable 308 or other plugging device from wiping away the TIM 302. The contained thermal interface material assembly 300 includes the TIM 302 and the spring-actuated TIM shield 304 incorporated within a connector 306, such as a printed circuit board (PCB) connector housing 306 to provide the necessary thermal coupling between the PCB connector housing 306 and a cable 308, such as a fiber optic cable 308. As the cable 308 is plugged, the spring-actuated shield 304 shifts to make sufficient contact with and compressing the TIM grease, putty, or pad material 302 to make sufficient contact. The cable 308 or other component 308 is plugged, making contact with the spring-actuated TIM shield 304 and slightly compressing the TIM 302 as shown after plugging in FIG. 3B. The purpose of the spring-actuated TIM shield 304 and the TIM 302 is to enable good contact and sufficient heat transfer between the cable 308 and the connector housing 306 providing sufficient heat transfer.

The combined thermal interface material (TIM) 302 and spring-actuated TIM shield 304 are resilient to plugging forces while providing effective thermal conductivity and preventing smearing, dislodging, and removal of the thermal interface material 302 during plugging operations, and are wear resistant and rebound when a cable 308 is plugged as illustrated in FIGS. 3A and 3B.

Figure 3C:
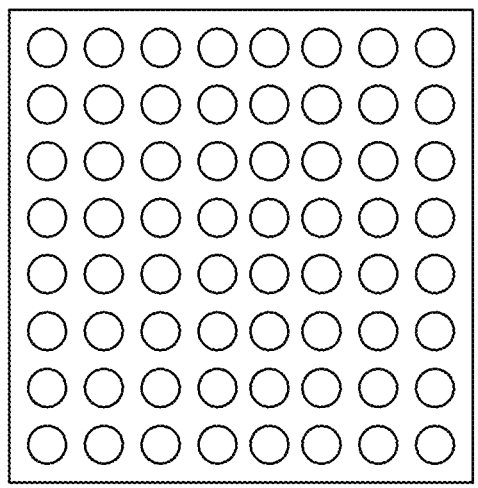
FIG. 3C illustrates a top view not to scale of the TIM shield of FIGS. 3A and 3B in accordance with the preferred embodiment.

FIG. 3C illustrates a top view not to scale of an example spring-actuated TIM shield 304. The spring-actuated TIM shield 304 is perforated to enable good contact and effective heat transfer between the cable 308 and the connector housing 306 or other receptacle 306. The spring-actuated TIM shield 304 is a compressible metal member formed of a selected thermally conductive metal such as copper, copper alloys, aluminum, aluminum alloys, steel, and includes other conductive ceramic and conductive polymeric materials. The thermal interface material 302 is formed of a selected thermally conductive material such as a putty, grease or pad thermally conductive material to provide the necessary thermal coupling between components 306 and 308.

It should be understood that the present invention is not limited to the illustrated contained thermal interface material assembly 300 and the illustrated spring-actuated TIM shield 304. For example, other spring-shield configurations are possible within the scope of the present invention. For example, the spring-actuated TIM shield could be attached to a guide system on the PCB connector 306 and allowed to rotate when the cable 308 is plugged or unplugged.

It should be understood that the present invention is not limited to each contained thermal interface material assembly 100, 200, and 300 as illustrated. It should be understood that various modifications can be provided to each contained thermal interface material assembly 100, 200, and 300 within the scope of the invention.

For example, in each contained thermal interface material assembly 100, 200, and 300, the metal mesh 104, 204 and the spring-actuated TIM shield 304 can be coated with a hydrophobic or oleophobic coating to help retain the TIM 102, 202, 302 through surface tension. In each contained thermal interface material assembly 100, 200, and 300, the metal mesh 104, 204 and the spring-actuated TIM shield 304 can and the thermal interface material TIM 102, 202, 302 could be functionalized to help bind the material to prevent leaking of the TIM 102, 202, 302.

In brief summary, each contained thermal interface material assembly 100, 200, and 300 is arranged such that the thermal interface material provides efficient and effective thermal coupling between components for plugging and unplugging thermal management applications. Each contained thermal interface material assembly 100, 200, and 300 is wear resistant and allows plugging and unplugging of adjacent components to prevent smearing, dislodging, or removal of the TIM while still maintaining adequate thermal conductivity.

While the present invention has been described with reference to the details of the embodiments of the invention shown in the drawing, these details are not intended to limit the scope of the invention as claimed in the appended claims.

What is claimed is:

1. A structure for implementing thermal coupling, comprising:
   a thermal interface material in contact with a surface of a connector housing;
   a metal member coupled to the connector housing, wherein the metal member is a compressible metal mesh or a perforated spring-actuated shield, and wherein the thermal interface material and the metal member provide effective thermal coupling between the connector housing and a pluggable component; and
   wherein the metal member prevents removal of the thermal interface material during plugging and unplugging of the pluggable component, and enables effective contact and heat transfer between the connector housing and the pluggable component.

2. The structure as recited in claim 1, wherein the pluggable component is a cable.

3. The structure as recited in claim 1, wherein the metal member is wear resistant and rebounds when the pluggable component is plugged into the connector housing.

4. The structure as recited in claim 1, wherein the metal member is formed of a selected thermally conductive metal including one of copper, a copper alloy, aluminum, an aluminum alloy, steel, a conductive ceramic material, and a conductive polymeric material.

5. The structure as recited in claim 1, wherein the thermal interface material is formed of a selected thermal interface material including one of a putty, a grease, and a pad thermal interface material.

6. The structure as recited in claim 1, wherein the connector housing is a printed circuit board (PCB) connector housing and the pluggable component is a cable.

7. The structure as recited in claim 2, wherein the cable is a fiber optic cable.

8. The structure as recited in claim 1, wherein the metal member is coated with a hydrophobic coating.

9. The structure as recited in claim 1, wherein the compressible metal mesh is impregnated with the thermal interface material.

10. The structure as recited in claim 1, wherein the compressible metal mesh is disposed on a surface of the thermal interface material.

11. A method for implementing thermal coupling, comprising:
    providing a pluggable cable component and a connector housing;
    providing a thermal interface material in contact with a surface of the connector housing;
    coupling a metal member to the connector housing, wherein the metal member is a compressible metal mesh or a perforated spring-actuated shield;
    using the thermal interface material and the metal member for providing effective thermal coupling between the connector housing and the pluggable component during plugging and unplugging of the pluggable component; and
    using the metal member to prevent removal of the thermal interface material during the plugging and unplugging.

12. The method as recited in claim 11, wherein the pluggable component is a cable.

13. The method as recited in claim 11, wherein the metal member is formed of a selected thermally conductive metal including one of copper, a copper alloy, aluminum, an aluminum alloy, steel, a conductive ceramic material, and a conductive polymeric material.

14. The method as recited in claim 11, wherein the perforated spring-actuated shield shifts to make contact with the thermal interface material when the pluggable component is plugged into the connector housing.

15. A structure for implementing thermal coupling, comprising:
    a connector housing and a mating cable, wherein the mating cable is plugged into the connector housing;
    a thermal interface material in contact with the mating cable and a surface of the connector housing;
    a metal member in contact with the thermal interface material and disposed between the mating cable and the connector housing, wherein the metal member is a compressible metal mesh or a perforated spring-actuated shield;
    wherein the thermal interface material and the metal member provide effective thermal coupling between the connector housing and the mating cable; and
    wherein the metal member prevents removal of the thermal interface material during plugging and unplugging of the mating cable.

* * * * *